US006883156B1

(12) United States Patent
Khainson et al.

(10) Patent No.: US 6,883,156 B1
(45) Date of Patent: Apr. 19, 2005

(54) APPARATUS AND METHOD FOR RELATIVE POSITION ANNOTATION OF STANDARD CELL COMPONENTS TO FACILITATE DATAPATH DESIGN

(75) Inventors: Alex Khainson, Morgan Hill, CA (US); Donald C. Ramsey, Jr., Los Altos Hills, CA (US); Lew Chua-Eoan, San Jose, CA (US); Era K. Nangia, Los Altos, CA (US)

(73) Assignee: MIPS Technologies, Inc., Mountain View, CA (US)

( * ) Notice: Subject to any disclaimer, the term of this patent is extended or adjusted under 35 U.S.C. 154(b) by 300 days.

(21) Appl. No.: 10/159,818

(22) Filed: May 31, 2002

(51) Int. Cl.[7] .............................................. G06F 17/50
(52) U.S. Cl. ............................................. 716/11; 716/3
(58) Field of Search ........................... 716/11, 7–9, 10, 716/12, 18, 3

(56) References Cited

U.S. PATENT DOCUMENTS

| | | | | |
|---|---|---|---|---|
| 5,367,469 A | * | 11/1994 | Hartoog | 716/10 |
| 5,452,231 A | * | 9/1995 | Butts et al. | 716/16 |
| 5,625,568 A | * | 4/1997 | Edwards et al. | 716/2 |
| 6,085,032 A | * | 7/2000 | Scepanovic et al. | 716/10 |
| 6,292,928 B1 | * | 9/2001 | Yamaguchi et al. | 716/13 |
| 6,375,395 B1 | * | 4/2002 | Heintzeman | 408/16 |
| 6,477,696 B1 | * | 11/2002 | Tien | 716/17 |
| 6,519,745 B1 | * | 2/2003 | Srinivas et al. | 716/5 |
| 6,539,530 B1 | * | 3/2003 | Torii | 716/12 |
| 6,557,145 B1 | * | 4/2003 | Boyle et al. | 716/2 |
| 2003/0084418 A1 | * | 5/2003 | Regan | 716/14 |

OTHER PUBLICATIONS

ARCADIA Design Systems, "The High–Performance SoC Leader," 2 pages, www.ArcadiaDesign.com, Copyright 2000, Arcadia Design Systems, Inc.
ARCADIA Design Systems, "The High Performance Datapath," May 24, 2002, pp. 1–7, http://www.arcadiadesign.com/Product.html, Copyright 2001, Arcadia Design Systems, Inc.
JUNIPER Networks, "DataPath Compiler," May 24, 2002, pp. 1–3, http://www.juniper.net/micromagic/datapath.html, Copyright 1998–2002, Juniper Networks, Inc.

* cited by examiner

Primary Examiner—Matthew Smith
Assistant Examiner—Granvill D. Lee, Jr.
(74) Attorney, Agent, or Firm—Cooley Godward LLP

(57) ABSTRACT

A method of designing a circuit includes annotating relative positions of instantiated hierarchical macro cells, which include two or more instantiated standard cells. The relative positions of individual instantiated standard cells may also be annotated. Relative positions of instantiated hierarchical macro cells and individual instantiated standard cells may be altered to form a more compact standard cell configuration. Pin positions may also be annotated by relative position. Relative pin positions may be altered to promote dense signal line routing within the standard cell design. The relative positions of the instantiated hierarchical macro cells and individual instantiated standard cells are converted to absolute grid position locations to form a grid assigned circuit. The grid assigned circuit is then routed.

29 Claims, 5 Drawing Sheets ately, a
APPARATUS AND METHOD FOR RELATIVE POSITION ANNOTATION OF STANDARD CELL COMPONENTS TO FACILITATE DATAPATH DESIGN

BRIEF DESCRIPTION OF THE INVENTION

This invention relates generally to electronic design automation tools used to design integrated circuits. More particularly, this invention relates to a technique for annotating the relative position of standard cell components, such as instantiated standard cells, instantiated hierarchical collections of standard cells, and pins in order to facilitate improved datapath designs.

BACKGROUND OF THE INVENTION

Very Large Scale Integrated (VLSI) circuits are designed with the use of Electronic Design Automation (EDA) tools, also called Computer Aided Design (CAD) tools. Various EDA tools are used to generate a netlist. A netlist defines components and interconnections between components required to implement the functional operation of a circuit. A netlist may be formed with a synthesis tool. Alternately, a netlist may be derived from a circuit schematic.

Once a netlist has been generated, there are a number of commercially available place and route tools, also called silicon compilers, which are used to convert the netlist into a semiconductor circuit layout. The semiconductor circuit layout specifies the physical implementation of the circuit in silicon, or some other semiconductive material.

Commercially available tools allow a designer varying degrees of control over the semiconductor circuit layout. A full-custom layout tool allows for full-custom layout of transistor components. Accordingly, a circuit may be highly optimized for a given parameter (e.g., size, power consumption, and the like). Full-custom layout ensures maximum performance. However, this performance comes at a cost. Working at this level of granularity requires a skilled designer and is time-consuming. Therefore, this approach is expensive. In addition, the resulting design is not easily ported to a technology with different physical parameters (e.g., transistor sizes, metal widths and spacings). Consequently, porting an existing full-custom design to a different technology can yield a substantially new layout after a time-consuming and expensive design process.

In contrast to full-custom layout, place and route tools support designing circuits with "standard cells." Standard cells allow the design layout to be composed at the gate level as opposed to the transistor level. Therefore, designing with standard cells allows one to design at a higher level of abstraction compared to the full-custom layout case. The higher level of abstraction results in design efficiencies, even though granular design control is lost.

Examples of standard cells include simple logic gates, such as inverters, NAND gates, and NOR gates. Standard cells may also include storage elements, such as latches and flip-flops. Standard cells may also include more complex compositions, such as multiplexers, AND_OR INVERT gates, and multiplexing latches. They are called standard cells because collectively they compose a "standard" library of base cells from which designs can be composed. When implemented in silicon, each cell has a standard physical dimension. This allows the cells to be aligned with one another to form standard cell tracks.

FIG. 1 illustrates a prior art standard cell configuration. The figure illustrates a first Vss power rail 20, a Vdd power rail 22, and a second Vss power rail 24. Three standard cells (Cell_1, Cell_2, and Cell_3) are positioned between the first Vss power rail 20 and the Vdd power rail 22. The distance between power rails, the rail-to-rail distance, is fixed throughout the standard cell region. This rail-to-rail distance dictates one standard physical dimension for all of the standard cells. On the other hand, the length of a standard cell along the rail axis is variable. As shown in FIG. 1, Cell_1 (e.g., a NAND gate), has a different axial length than Cell_2 (e.g., a latch). Similarly, Cell_3 (e.g., an adder) has a larger axial length than Cell_2. The same random axial length sizing can also be observed in connection with Cell_4 and Cell-5, positioned between Vdd power rail 22 and second Vss power rail 24.

To simplify FIG. 1, connections between the standard cells (Cell_1 through Cell_5) and the power rails 20, 22, and 24 are omitted. Also, signal tracks running over or beneath the standard cells are omitted for simplification. However, it should be appreciated that power connections and signal track connections to the standard cells are part of the design.

As shown in FIG. 1, standard cell designs commonly result in random layouts with irregular axial length sizing. In addition, standard cell designs commonly have poor line routing between connected standard cells. For example, signal lines regularly extend across different power rails instead of being constrained to the standard cells positioned between one set of power rails. Highly structured designs are conducive to compact and efficient line routing schemes, yet such schemes are rarely achieved in standard cell designs because existing techniques do not allow for significant design constraints that result in layout regularity.

Advantageously, standard cell designs are portable to new technologies. Generating a layout in a new technology only requires the porting of the standard cell library and re-running the place and route tool. While these porting operations are far superior to the porting operations available in a full-custom layout, the resulting circuits are often inefficient, unpredictable, and cannot meet the speed requirements necessary in high-performance designs, particularly in datapaths and similar structures. Many of these shortcomings stem from the inefficient routing of signal lines, as discussed above.

In view of the foregoing, it would be highly desirable to provide an improved electronic design automation technique. In particular, it would be desirable to provide a technique that supplies the design flexibility and compactness of a full-custom layout approach, while providing the simplicity and portability of a standard cell approach.

SUMMARY OF THE INVENTION

A method of designing a circuit includes annotating relative positions of instantiated hierarchical macro cells, which include two or more instantiated standard cells. The relative positions of individual instantiated standard cells may also be annotated. Relative positions of instantiated hierarchical macro cells and individual instantiated standard cells may be altered to form a more compact standard cell configuration. Pin positions may also be annotated by relative position. Relative pin positions may be altered to promote dense signal line routing within the standard cell design. The relative positions of the instantiated hierarchical macro cells and individual instantiated standard cells are converted to absolute grid position locations to form a grid assigned circuit. The grid assigned circuit is then routed.

The invention also includes a computer system with a standard cell layout generation tool to produce an initial design of standard cells. A relative position annotation module facilitates the annotation of relative positions of instantiated hierarchical macro cells and pins within the initial design. An absolute position assignment module converts the relative positions of the instantiated hierarchical macro cells to absolute grid position locations to form a grid assigned circuit.

The invention further includes a computer readable medium to direct a computer to function in a specified manner. A first set of instructions operates to annotate relative positions of instantiated hierarchical macro cells within a standard cell design. Second instructions convert the relative positions of the instantiated hierarchical macro cells to absolute grid position locations to form a grid assigned circuit. Third instructions place and route the grid assigned circuit to form a routed circuit.

The layout directives utilized in accordance with the invention provide an annotated hierarchy of relative circuit component positioning. This relative positioning is converted into absolute circuit component positioning information, which is used by standard place and route tools to produce a very efficient layout. In accordance with the invention, the layout directives allow a designer to position pins, cells and hierarchical collections of cells. The positioning of cells and hierarchical collections of cells is used to promote compact and efficient standard cell designs. The positioning of pins is used to promote dense and efficient signal routing. Thus, the invention allows designers to achieve dense, structured layouts of datapaths and other regular circuit structures without having to resort to fill-custom layout techniques.

Since the layout directives are specified as relative circuit component positions, these relative positions are easily reconfigured for different technologies. Thus, existing designs are readily ported to new technologies.

Advantageously, standard place and route tools can process the layout directives. Thus, the invention achieves improved standard cell designs, while relying upon standard place and route tools. In addition, the invention successfully operates in connection with traditional standard cells and other custom cells with regular configurations.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
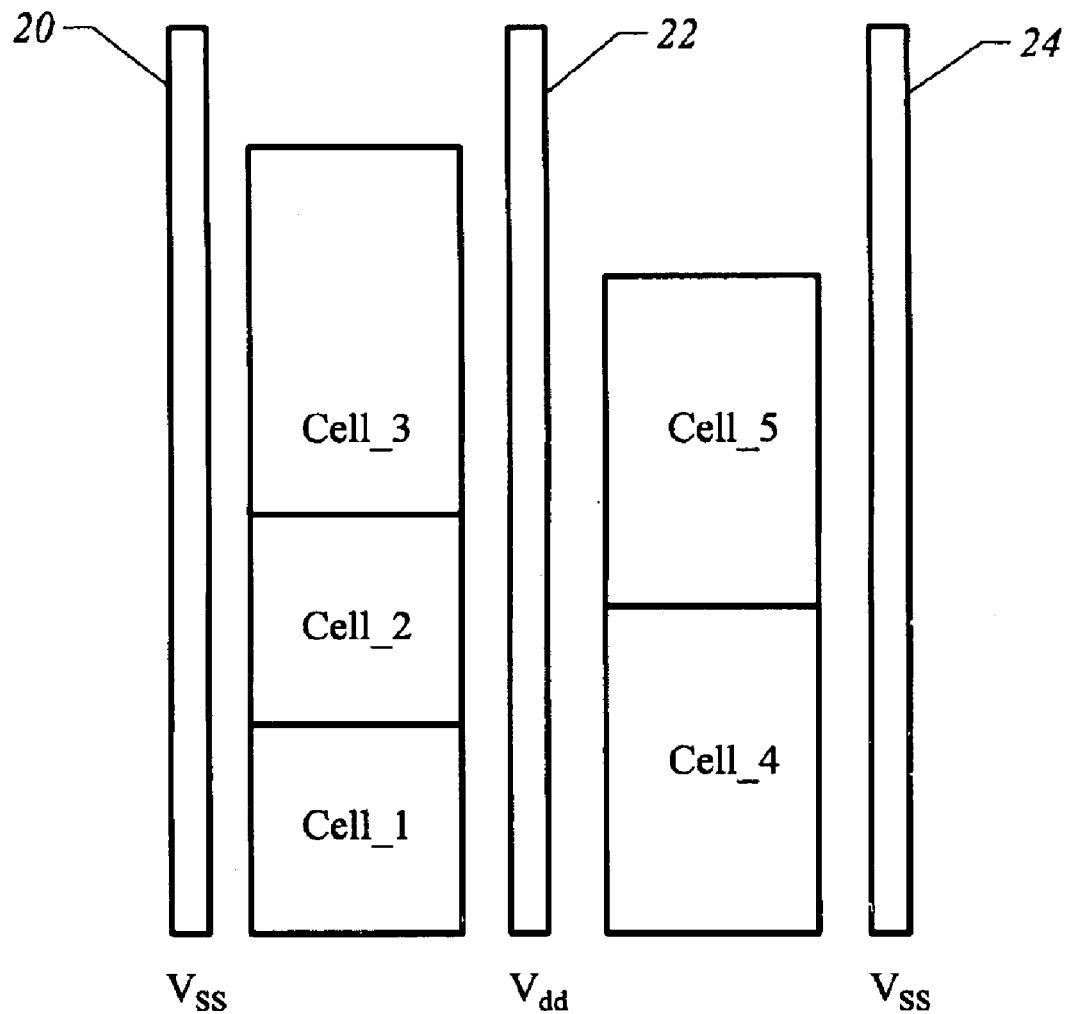
FIG. 1 illustrates a standard cell layout configured in accordance with the prior art.
Figure 2:
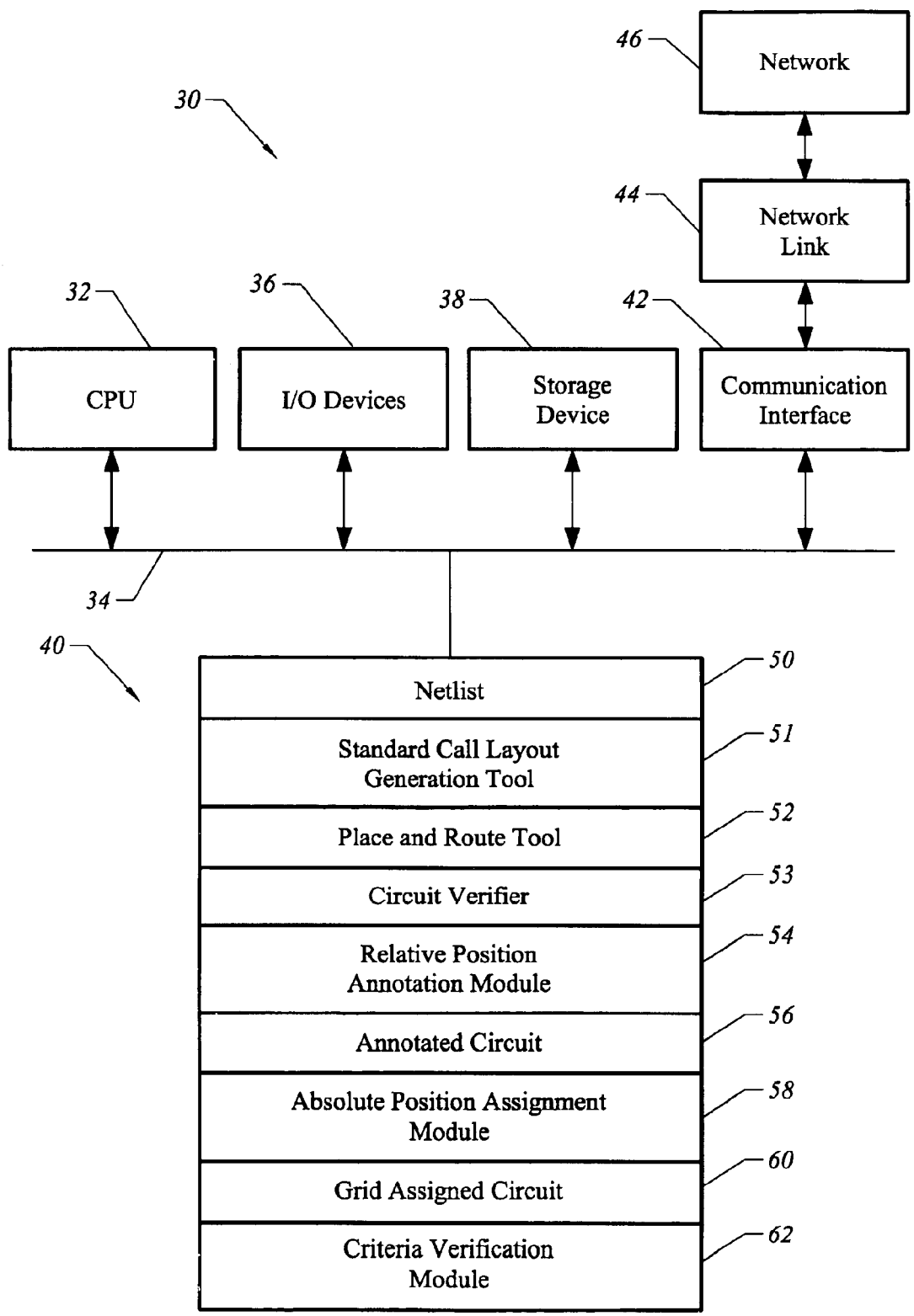
FIG. 2 illustrates an apparatus configured in accordance with an embodiment of the invention.

FIG. 2 illustrates an apparatus 30 configured in accordance with an embodiment of the invention. The apparatus 30 includes a central processing unit (CPU) 32 connected to a system bus 34. Input/output devices 36 are also connected to the system bus 34. By way of example, the input/output devices 36 include a keyboard, mouse, display, printer, and the like. A storage device 38 is also connected to the system bus 34. As discussed below, the storage device 38 is a permanent storage device that stores executable programs that are subsequently executed from primary memory 40. A communication interface 42 is also connected to the system bus 34. The communication interface 42 is connected to a network link 44, which is in turn connected to a network 46, as discussed below.

The components of apparatus 30 discussed up to this point are well known, as they form typical elements of a computer. The invention is directed toward the executable programs processed by the apparatus 30. The executable programs include prior art programs and data along with program and data formed in accordance with the invention. The memory 40 stores a prior art netlist 50. As previously indicated, a netlist defines components and interconnections between components required to implement a functional circuit. The memory also stores a standard cell layout generation tool 51, which may be used to generate a layout specifying a standard cell design. A commercially available prior art standard cell layout generation tool may be used in connection with the invention.

The memory 40 also stores a prior art place and route tool 52. As previously indicated, a place and route tool 52 converts a netlist into a semiconductor circuit layout, where the semiconductor circuit layout specifies the physical implementation of the circuit in silicon or some other semiconductive material. The memory 40 also stores a prior art circuit verifier 53. The circuit verifier 53 broadly refers to any tool that verifies the performance of a routed circuit. Thus, the circuit verifier 53 may include a logic verifier, a timing verifier, and the like.

The executable programs disclosed up to this point are known in the art and therefore are readily utilized in conjunction with the executable modules configured in accordance with the invention. The executable modules of the invention include a relative position annotation module 54. The relative position annotation module 54 facilitates the annotation of relative positions of instantiated standard cells within a standard cell layout. In addition, the relative position annotation module 54 facilitates the annotation of collections of instantiated standard cells, which are sometimes referred to herein as hierarchical macro cells. This results in an annotated circuit 56. The annotated circuit 56 illustrates instantiated standard cells, hierarchical macro cells, and their relative positions within a standard cell layout.

An absolute position module 58 is also stored in the memory 40. The absolute position module 58 converts the relative positions of the instantiated standard cells to absolute grid position locations to form a grid assigned circuit 60. The grid assigned circuit is a placed circuit. In accordance with the invention, a circuit designer can intuitively work on a relative position basis during the design process. Relative positions of cells, hierarchical macro cells, and pins may be modified to form more optimal designs, as discussed below. The relative position information is then ported to absolute grid position locations. Therefore, a single circuit design is easily mapped to different technologies, without having to redesign the circuit. The grid assigned circuit 60 is processed by the place and route tool 52 to form a routed circuit. The circuit verifier 53 may then be used to verify the performance of the routed circuit. A criteria verification module 62 may then be used to determine whether specified circuit performance is met. If not, the relative position annotation module 54 may be invoked to modify the circuit design.

The executable programs of the invention have now been introduced. It should be appreciated that the functions of the executable programs have been divided for illustrative purposes. The instructions associated with one function may be combined with another function, or the instructions associated with one function may be further sub-divided into multiple sub-functions, all in accordance with the invention. The operation of the executable programs and the processing associated with the present invention are more fully appreciated with reference to FIG. 3.

Figure 3:
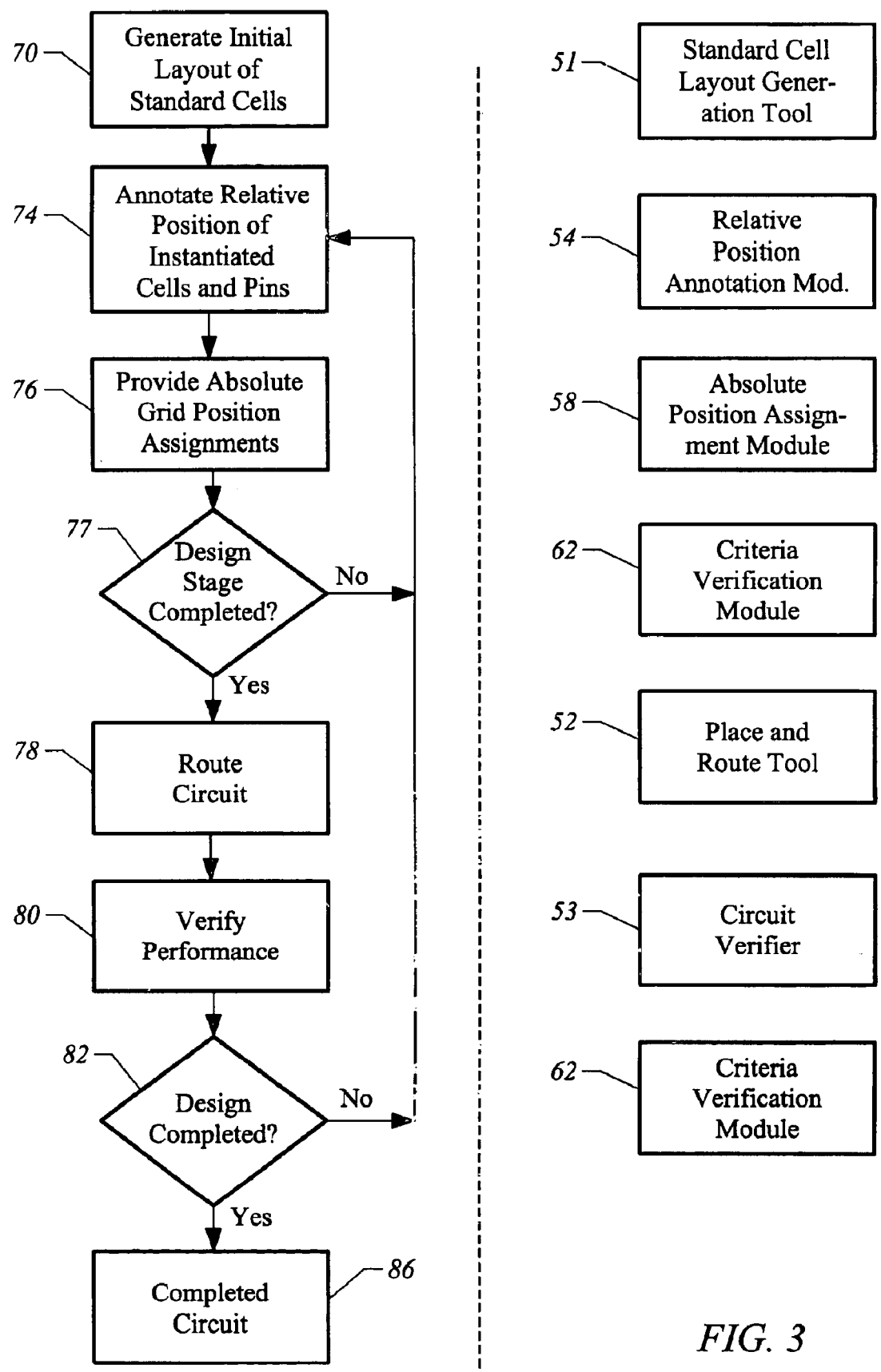
FIG. 3 illustrates processing operations performed in accordance with an embodiment of the invention.

The left side of FIG. 3 illustrates processing steps performed in accordance with an embodiment of the invention. The right side of FIG. 3 illustrates executable programs that may be used to implement the processing steps.

Figure 4:
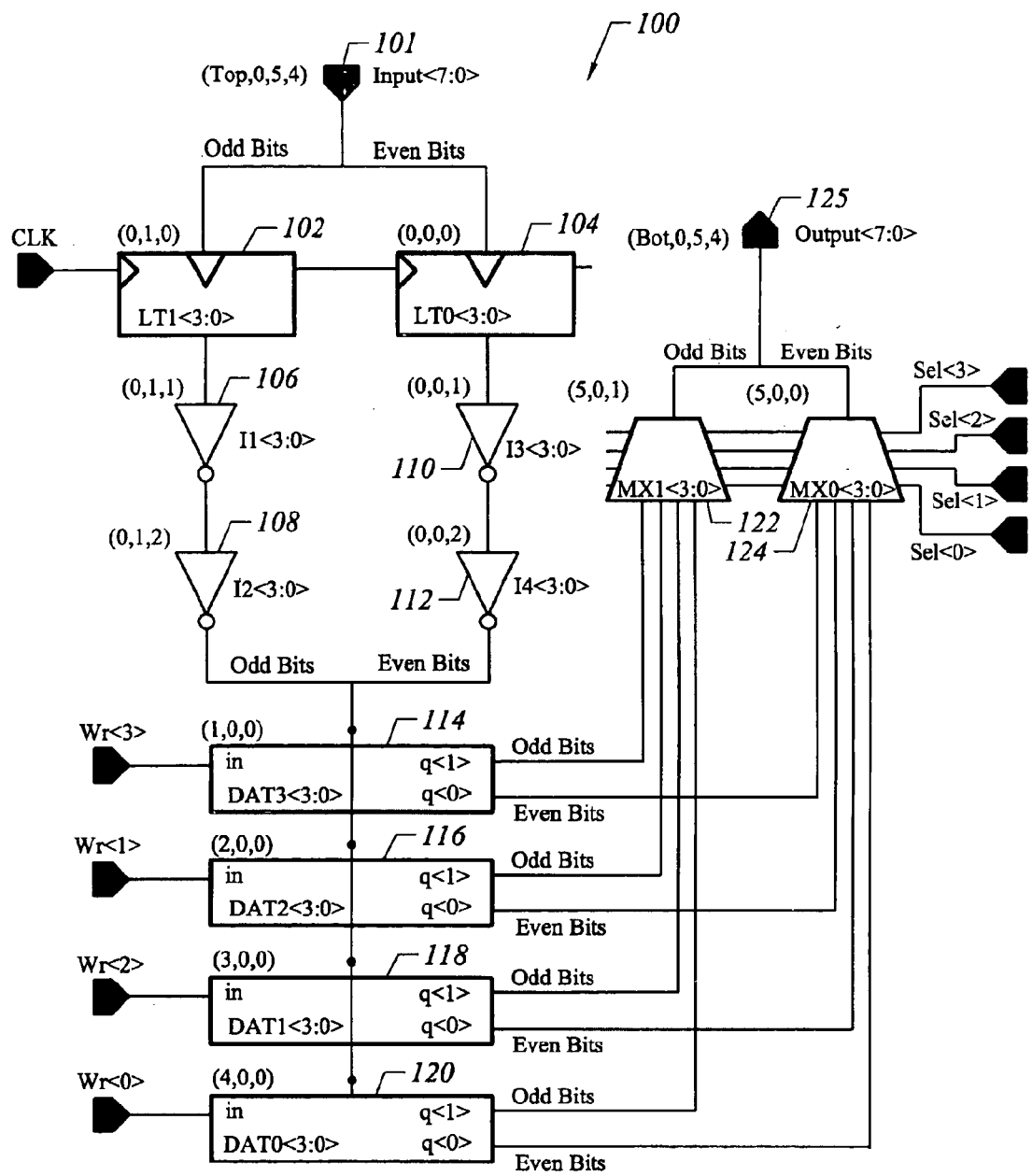
FIG. 4 illustrates a schematic with standard cell relative position annotations in accordance with an embodiment of the invention.

The first processing step associated with the invention is to generate an initial layout of standard cells (block 70). A standard cell layout generation tool 51 may be used to implement this operation. The relative position of instantiated standard cells, hierarchical macro cells, and pins is then annotated (block 74). FIG. 4 illustrates a schematic 100 that is implemented in a standard cell layout. In accordance with the invention, relative position information associated with the standard cell layout is incorporated into the schematic 100.

The schematic 101 illustrates an input port 101. The input port 100 receives an 8-bit signal, as denoted by the <7:0> schema. The odd input bits are applied to a first latch 102, while the even input bits are applied to a second latch 104. The first latch 102 is denoted by its instance name "LT1". The schema <3:0> indicates that it receives four bits. The second latch 104 is denoted by its instance name "LT0". It also receives four bits, as indicated by the <3:0> schema. The signals from the first latch 102 are applied to a set of inverters 106 and 108. Inverter 106 has an instance name of "11". This inverter receives four odd bits, as indicated by the <3:0> schema. Inverter 108 has an instance name of "12" and receives the four odd bits from inverter 106. The signals from the second latch 104 are applied to a set of four bit inverters 110 and 112, with instance names of "13" and "14", respectively.

The signals processed by the inverters are then applied to hierarchical macro cells 114, 116, 118, and 120. Each hierarchical macro cell processes four bits using two separate flip-flops. Each instantiated hierarchical macro cell serves as a "container" for a set of instantiated standard cells. An instantiated hierarchical macro cell has a relative position associated with it. In addition, the cells within the hierarchical macro cell have relative positions. The hierarchical macro cells 114, 116, 118, and 120 have instance names of DAT3, DAT2, DAT1, and DAT0, respectively.

The output signals from the flip-flops 114–120 are applied to multiplexers 122 and 124, with instance names MX1 and MX0, respectively. The output signals from the multiplexers are then applied to an eight bit output port 125.

FIG. 4 illustrates an exemplary datapath. The relative position annotation module 54 may be configured to automatically insert relative position information into a schematic, such as shown in FIG. 4. Alternately, the relative position annotation module 54 may be configured as an interface that allows the manual insertion of relative position information. In either configuration, an annotated circuit 56 is formed. The annotated circuit 56 includes relative position information for each instantiated cell and each instantiated hierarchical macro cell. In one embodiment of the invention, the relative position of each instantiated cell and hierarchical macro cell is specified by a row offset value, a column offset value, and a stack offset value.

The standard cell layout may be viewed as a block area representing a grid. All cell instances are positioned within the grid. In this example, relative position within the grid is represented by a row and column offset from the upper right-hand corner of FIG. 4. That is, numbering is from right to left and top to bottom. Columns are counted from right to left, while rows are counted from top to bottom. To improve space utilization, the invention provides the capability of having more than one cell at the same grid location. To support this feature, an additional property must be specified for the instances corresponding to layout leaf cells. This property specifies the relative instance position within the grid rectangle. This property may be identified as stack offset. Stack offset increases from top to bottom.

FIG. 4 illustrates the annotation of the relative position of instantiated cells using a scheme of (row offset, column offset, and stack offset). This schema is shown at the upper left corner of each instance. Thus, for example, latch 104 has a relative position of (0, 0,0), indicating a row offset of zero, a column offset of zero, and a stack offset of zero. Latch 102 has a relative position of (0,1,0), indicating a row offset of zero, a column offset of one, and a stack offset of zero. Latch 102 is in the same row as latch 104, but is in a different vertical column, and therefore has a different relative position.

Inverter 110 has a relative position of (0,0,1), indicating a row offset of zero and a column offset of zero, just like latch 104. However, unlike latch 104, inverter 110 has a different stack position, namely a stack position of one, instead of a stack position of zero, as was the case with latch 104. Inverter 112 has a relative position of (0,0,2). This is the same relative position as inverter 10 with respect to row offset and column offset, but it is a different stack position, namely, a stack position of two, instead of a stack position of one. The inverters 106 and 108 share a common row offset and column offset position with the latch 102, but they have different stack positions, with inverter 106 having a stack position of 1 and inverter 108 having a stack position of 2.

The stack offset feature of the invention allows a designer to place or stack a number of relatively small standard cell circuit instances at a single row and column coordinate position. Thus, the designer can avoid unused spaces and otherwise form a more compact design.

The datapath of FIG. 4 also includes a set of hierarchical macro cells 114, 116, 118, and 120. As previously indicated, each hierarchical macro cell can operate as a container for a set of standard cells or a set of other hierarchical macro cells. For example, in a three-tier structure, a hierarchical macro cell at the top level (e.g., an arithmetic logic unit) may contain multiple hierarchical macro cells at the second level (e.g., registers), which in turn contain standard cells (e.g., flip-flops at the leaf level).

In the example of FIG. 4, each hierarchical macro cell includes two flip-flop standard cells. This can be appreciated with reference to FIG. 5, which is discussed below. The first hierarchical macro cell 114 is in the second row, column zero, and has no stack offset: (1,0,0). The remaining hierarchical macro cells are each in a new ascending row number, but are positioned at the same column and have no offset.

The multiplexers 122 and 124 are in the fifth row. Multiplexer 124 is in the fifth row at column zero, and stack position zero: (5,0,0). Multiplexer 122 is in the fifth row at column zero, and stack position one: (5,0,1).

As shown in FIG. 4, the relative positions of circuit instances are annotated in accordance with the invention. Another feature of the invention is to annotate the relative position of pins in the schematic. In one embodiment, the relative pin position is annotated by specifying a pin perimeter position, a pin column, a pin track, and a pin metal layer. Pin perimeter positions may include top, bottom, left side, and right side. Typically, it is only necessary to specify the top and bottom perimeter positions, because it is these positions that promote efficient and dense signal line routing between adjacent standard cells. Thus, in FIG. 4, the pins on the left and right side of the figure are not annotated, whereas pins 101 and 125 are annotated.

The pin column position corresponds to the column position specified in connection with the circuit instances. The pin track position is the signal line track within a column. The pin metal layer is specified in multi-layer metal integrated circuits.

Thus, input pin 101 of FIG. 4 is annotated as having a "top" pin perimeter position, a pin column position of zero, a pin track position of 5, and a metal layer of four: (Top, 0, 5, 4). Output pin 125 is annotated as having a "bottom" pin perimeter position, a pin column position of zero, a pin track position of five, and a metal layer of four: (Bot, 0, 5, 4). Observe that the top and bottom pin are at the same lateral location, but at the top and bottom of the standard cell. Thus, straight signal lines are formed across the standard cell. Pins on adjacent standard cells can be placed at the same lateral position to force additional straight signal lines between standard cells. By aligning signal pins in this manner, dense signal line routing within the standard cell layout can be achieved. This stands in contrast to the relatively random signal line routing that may result using prior art techniques.

Returning now to FIG. 3, the next processing step is to provide absolute grid position assignments (block 76), which results in a grid assigned circuit 60. An absolute position assignment module 58 may be used for this operation. The absolute position assignment module 58 includes executable instructions to map the relative grid positions of the annotated circuit to absolute physical grid positions. Observe that the specified relative grid positions can be easily ported to different physical grid positions associated with different implementation technologies. Therefore, the technique of the invention allows a circuit design to be easily ported to new implementation technologies.

Figure 5:
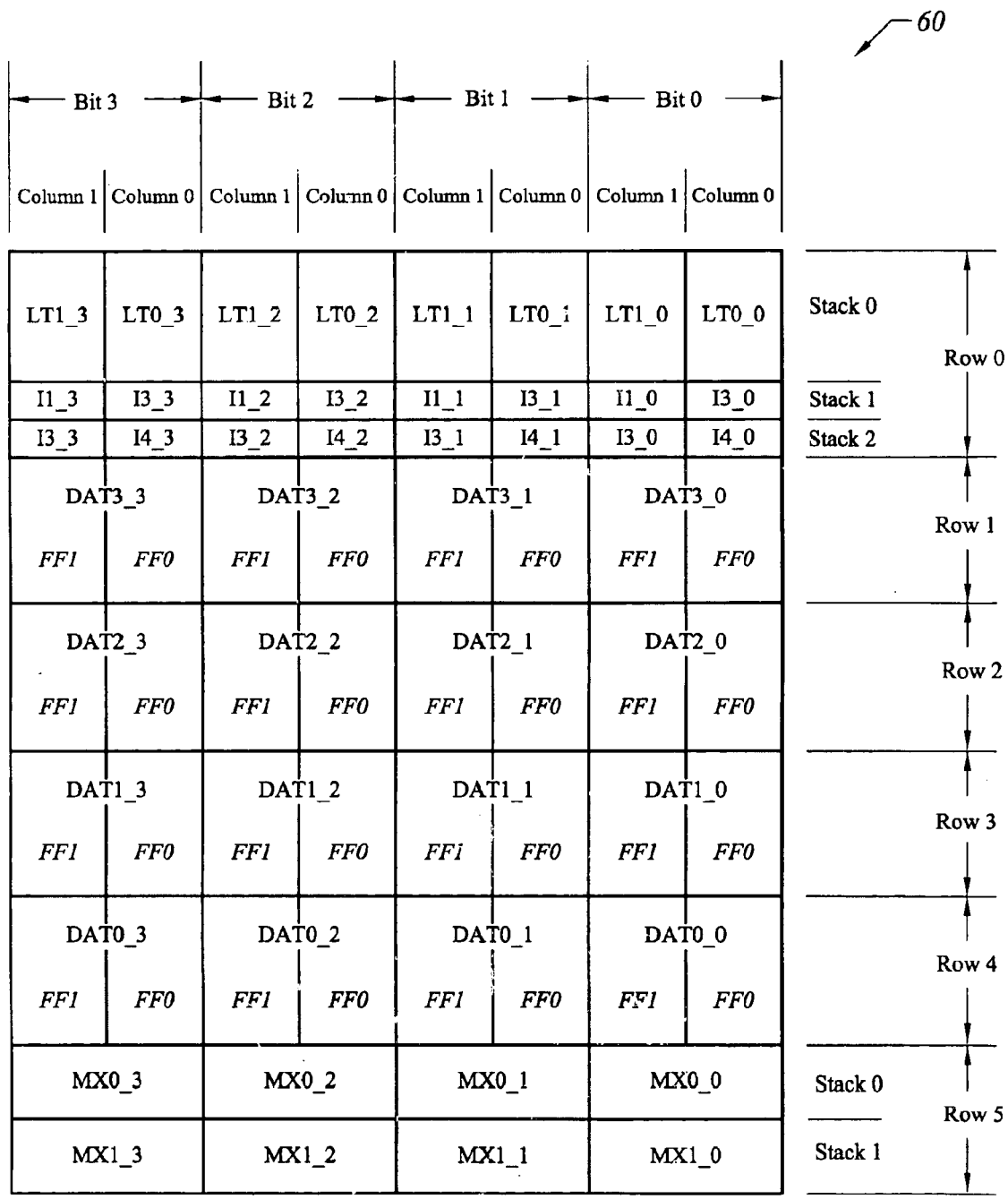
FIG. 5 illustrates a grid assigned circuit with absolute physical positions formed in accordance with an embodiment of the invention.

The absolute position assignment module 58 generates a grid assigned circuit 60. The grid assigned circuit 60 is a placed circuit. The grid assigned circuit specifies bit slice datapaths corresponding to the annotated schematic. The bit slice datapath includes multiple standard cell instances, with each standard cell instance being positionally defined by a column position, a row position, and a stack position. The grid assigned circuit also reflects hierarchical macro cells. A grid assigned circuit 60 corresponding to the schematic of FIG. 4 is shown in FIG. 5. The grid assigned circuit 60 of FIG. 5 includes four bit slices: bit 0, bit 1, bit 2, and bit 3. Each bit slice includes two columns, as shown.

FIG. 5 illustrates five rows, corresponding to the five rows in the annotated schematic of FIG. 4. The latches LT1 (102) and LT0 (104) of FIG. 4 are shown in FIG. 5 at row zero, stack zero. The latch LT0 is in the zero column position of Bit 0, Bit 1, Bit 2, and Bit 3. The latch LT1 is in the first column position of Bit 0, Bit 1, Bit 2, and Bit 3.

Row zero also has two inverters 11 (106) and 13 (110) at the first stack position (Stack 1). Inverter 13 is in the zero column position of Bit 0, Bit 1, Bit 2, and Bit 3. The inverter 11 is in the first column position of Bit 0, Bit 1, Bit 2, and Bit 3. Row zero also has two inverters 12 (108) and 14 (112) at the second stack position (stack 2). Inverter 14 is in the zero column position of Bit 0, Bit 1, Bit 2, and Bit 3. The inverter 13 is in the first column position of Bit 0, Bit 1, Bit 2, and Bit 3.

Hierarchical macro cell 114 (instance DAT3) is positioned in row one. The hierarchical macro cell is positioned across the four bit slices. Observe that the hierarchical macro cell is formed from two individual standard cells: a first flip-flop (FF0) and a second flip-flop (FF1). Repositioning of the hierarchical macro cell automatically repositions the individual standard cells contained within the hierarchical macro cell. The same is true in multi-level situations where a first hierarchical macro cell moves multiple hierarchical macro cells at the next lower level, which in turn may move additional hierarchical macro cells until reaching the leaf level, thereby moving the standard cells. Inverse motion also occurs. That is, movement of a standard cell will result in movement in the hierarchical macro cells to which the moved standard cell belongs. Hierarchical macro cell 116 (DAT2) is positioned in row two, hierarchical macro cell 118 (DAT1) is positioned in row three, and hierarchical macro cell 120 (DAT0) is positioned in row four.

As shown in FIG. 5, the multiplexers MX0 and MX1 are positioned in row five. Multiplexer MX0 is positioned in row five, stack position zero. As shown, the multiplexer is distributed across the four bit slices. Multiplexer MX1 is positioned in row five, stack position one. Multiplexer MX1 is distributed across the four bit slices of FIG. 5.

Observe that FIG. 5 only illustrates instantiated cells. The relative positions of the pins are not included in the figure. However, this relative pin position is still associated with the grid assigned circuit and is processed by the place and route tool when the circuit is routed, as discussed below.

The grid assigned circuit 60 of FIG. 5 illustrates how the relative position assignments ascribed in a previous operation result in a flattened hierarchical map where one can observe the positioning of standard cell instances. This view allows a designer to confirm the efficacy of the design and provides the opportunity to re-annotate the standard cell layout to improve performance, for example, by forming a more compact standard cell design.

As shown in FIG. 3, after a grid assigned circuit has been generated, a decision can be made to confirm that this design stage is completed (block 77). If the design stage is not completed, then control can return to block 74, where the instantiated cells, macro cells, and pins are annotated by relative position. A designer may make the decision regarding a completed design or it may be automatically invoked through the criteria verification module 62. The criteria verification module 62 includes executable instructions to assess the grid assigned circuit 60 in accordance with predetermined criteria (e.g., compactness).

If the design is completed, then a circuit is routed based upon the grid assigned circuit (block 78). The place and route tool 52 performs this operation. Commercially available place and route tools readily process circuit components that are assigned to a physical grid. In this invention, the positions to the physical grid were not assigned through a design process working at the absolute physical space level. Rather, the circuit was designed based upon relative physical space positioning. This provides a more intuitive design interface, while allowing the relative positions to be ported to a number of different architectures by the absolute position assignment module 58.

After the circuit is placed and routed, its performance is preferably verified (block 80). A commercially available circuit verifier 53 may be used for this purpose. The circuit verifier 53 may perform logic verification, timing verification, and the like.

The circuit verification performance is then analyzed to determine whether the design is completed (block 82). The criteria verification module 84 may once again be used for this operation. The criteria verification module analyzes whether specified circuit performance is met. If the specified circuit performance is not met, then control can return to block 74, otherwise, the circuit is completed (block 86).

The invention has now been fully described. Attention presently turns to alternate embodiments associated with the invention. The programs stored in memory 40 may be downloaded from a computer readable medium associated with the storage device 38, or alternately, may be directly executed from the computer readable medium. The term computer readable medium refers to any medium that participates in providing instructions to the processor 32 for execution. Such a medium may take many forms, including but not limited to, non-volatile media, volatile media, and transmission media. Non-volatile media includes, for example, optical or magnetic disks, associated with the storage device. Volatile media includes dynamic memory. Transmission media includes coaxial cables, copper wire and fiber optics, including the wires that comprise bus 34. Transmission media can also take the form of acoustic or light waves, such as those generated during radiowave and infra-red data communications.

Common forms of computer readable media include, for example, a floppy disk, a flexible disk, a hard disk, magnetic tape, or any other magnetic medium. Computer readable media also includes a CD-ROM, any other optical medium, punchcards, papertape, any other physical medium with patterns of holes, a RAM, a PROM, an EPROM, a FLASH-EPROM, any other memory chip or cartridge, a carrier wave as described below, or any other medium from which a computer can read.

Various forms of computer readable media may be involved in carrying one or more sequences of one or more instructions to processor 32 for execution. For example, the instructions may initially be carried on a magnetic disk of a remote computer. The remote computer can load the instructions into its dynamic memory and send the instructions over a telephone line using a modem. A modem local to the computer system can receive the data on the telephone line and use an infra-red transmitter to convert the data to an infra-red signal. An infra-red detector coupled to the bus can receive the data carried in the infra-red signal and place the data on bus 34. The bus then carries the data to the memory from which the processor retrieves and executes the instructions. The instructions received by the memory 40 may be optionally stored on the storage device 38 either before or after execution by the processor 32.

The computer system 30 also includes a communication interface 42 coupled to the bus 34. The communication interface 42 provides a two-way data communication coupled to a network link 44 that is connected to a network 46. For example, the communication interface 42 may be an integrated services digital network (ISDN) card or a modem to provide a data communication connection to a corresponding type of telephone line. As another example, the communication interface may be a local area network (LAN) card to provide a data communication connection to a compatible LAN. Wireless links may also be implemented. In any such implementation, the communication interface 42 sends and receives electrical, electromagnetic or optical signals that carry digital data streams representing various types of information.

The network link 44 typically provides data communication through one or more networks, represented by the network 46. For example, the network link 44 may provide a connection to a network 46 that includes a host computer operated as an Internet Service Provider (ISP). The ISP in turn provides data communication services through the worldwide packet data communication network 46, now commonly referred to as the Internet. The network 46 uses electrical, electromagnetic or optical signals that carry digital data streams. The signals through the various networks and the signals on the network link and through the communication interface, which carry the digital data to and from the computer system 30 are exemplary forms of carrier waves transporting information.

The computer system 30 can send messages and receive data, including program code, through the network, the network link, and the communication interface. In the Internet example, a server on the network 46 may transmit a requested code for an application program through the network 46, the network link 44, and the communication interface 42. The processor 32 may execute the received code as it is received and/or stored in the storage device 38, or other non-volatile storage for subsequent execution. In this manner, the computer system may obtain application code in the form of a carrier wave.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, and thereby enable others skilled in the art to best utilize the invention and various embodiments with various modifications as are suited to the particular use contemplated. It is intended that the following claims and their equivalents define the scope of the invention.

What is claimed is:

1. A method of designing a circuit, comprising:
    annotating relative positions of instantiated hierarchical macro cells within a standard cell design;
    converting said relative positions of said instantiated hierarchical macro cells to absolute grid position locations to form a grid assigned circuit; and
    routing said grid assigned circuit to form a routed circuit;
    wherein annotating includes annotating relative pin positions within said standard cell design;
    wherein annotating includes altering a relative position of a pin to facilitate dense signal line routine within said standard cell design; and
    wherein annotating said relative pin position includes specifying a pin perimeter position, a pin column, a pin track, and a pin metal layer for a pin.

2. The method of claim 1 wherein annotating relative positions of instantiated hierarchical macro cells includes altering a relative position of an instantiated hierarchical macro cell to form a more compact standard cell configuration.

3. The method of claim 2 wherein altering a relative position of an instantiated hierarchical macro cell alters positions of standard cells associated with said instantiated hierarchical macro cell.

4. A method of designing a circuit, comprising:
annotating relative positions of instantiated hierarchical macro cells within a standard cell design;
converting said relative positions of said instantiated hierarchical macro cells to absolute grid position locations to form a grid assigned circuit; and
routing said grid assigned circuit to form a routed circuit;
wherein annotating relative positions of instantiated hierarchical macro cells includes annotating individual standard cells contained within said instantiated hierarchical macro cells; and
wherein annotating said relative positions of said instantiated hierarchical macro cells includes specifying a row offset, a column offset, and a stack offset for each individual standard cell contained within said instantiated hierarchical macro cells.

5. The method of claim 4 wherein annotating includes annotating relative pin positions within said standard cell design.

6. The method of claim 5 wherein annotating includes altering a relative position of a pin to facilitate dense signal line routing within said standard cell design.

7. A method of designing a circuit, comprising:
annotating relative positions of instantiated hierarchical macro cells within a standard cell design;
converting said relative positions of said instantiated hierarchical macro cells to absolute grid position locations to form a grid assigned circuit; and
routing said grid assigned circuit to form a routed circuit;
wherein said converting includes forming a grid assigned circuit specifying bit slice datapaths.

8. The method of claim 7 wherein said converting includes specifying a bit slice datapath including multiple standard cell instances, each standard cell instance being positionally defined by a column position, a row position, and a stack position.

9. The method of claim 7 further comprising verifying the performance of said routed circuit.

10. The method of claim 9 further comprising selectively repeating said annotating, converting, and placing and routing in response to said verifying.

11. The method of claim 7 wherein said converting forms a grid assigned circuit that is a placed circuit.

12. A computer system, comprising:
a standard cell layout generation tool to produce an initial design of standard cells;
a relative position annotation module to facilitate the annotation of relative positions of instantiated hierarchical macro cells and pins within said initial design; and
an absolute position assignment module to convert said relative positions of said instantiated hierarchical macro cells to absolute grid position locations to form a grid assigned circuit;
wherein said relative position annotation module facilitates the alteration of a relative position of an instantiated hierarchical macro cell to form a more compact standard cell configuration;
wherein said relative position annotation module facilitates the annotation of individual standard cell cells by row offset, column offset, and stack offset.

13. The computer system of claim 12 further comprising:
a circuit verifier to verify performance of a routed circuit derived from said grid assigned circuit.

14. The computer system of claim 13 further comprising a criteria verification module to invoke said relative position annotation module when specified circuit performance is not met.

15. The computer system of claim 12 wherein said relative position annotation module facilitates the alteration of a pin position to facilitate dense signal line routing within said standard cells.

16. A computer system, comprising:
a standard cell layout generation tool to produce an initial design of standard cells;
a relative position annotation module to facilitate the annotation of relative positions of instantiated hierarchical macro cells and pins within said initial design, wherein said relative position annotation module facilitates the annotation of a pin by pin perimeter position, pin column, pin track, and pin metal layer; and
an absolute position assignment module to convert said relative positions of said instantiated hierarchical macro cells to absolute grid position locations to form a grid assigned circuit.

17. The computer system of claim 16 wherein said relative position annotation module tracks the relative positions of individual standard cells contained within said instantiated hierarchical macro cells.

18. A computer system, comprising:
a standard cell layout generation tool to produce an initial design of standard cells;
a relative position annotation module to facilitate the annotation of relative positions of instantiated hierarchical macro cells and pins within said initial design;
an absolute position assignment module to convert said relative positions of said instantiated hierarchical macro cells to absolute grid position locations to form a grid assigned circuit, wherein said absolute position assignment module forms a grid assigned placed circuit specifying routed bit slice datapaths.

19. The computer system of claim 18 wherein said absolute position assignment module forms a bit slice datapath including multiple standard cell instances, each standard cell instance being positionally defined by a column position, a row position, and a stack position.

20. A computer readable medium to direct a computer to function in a specified manner, comprising:
first instructions to annotate relative positions of instantiated hierarchical macro cells within a standard cell design, wherein said first instructions include instructions to facilitate the annotation of relative pin positions within said standard cell design;
second instructions to convert said relative positions of said instantiated hierarchical macro cells to absolute grid position locations to form a grid assigned circuit; and
third instructions to route said grid assigned circuit to form a routed circuit.

21. The computer readable medium of claim 20 wherein said first instructions include instructions to facilitate the altering of a relative position of an instantiated hierarchical macro cell to form a more compact standard cell design.

22. A computer readable medium to direct a computer to function in a specified manner, comprising:
first instructions to annotate relative positions of instantiated hierarchical macro cells within a standard cell design, wherein said first instructions include instructions to facilitate the specification of a pin perimeter position, a pin column, a pin track, and a pin metal layer for a pin;

second instructions to convert said relative positions of said instantiated hierarchical macro cells to absolute grid position locations to form a grid assigned circuit; and third instructions to route said grid assigned circuit to form a routed circuit.

23. The computer readable medium of claim 22 wherein said first instructions include instructions to track the relative positions of individual standard cells contained within said instantiated hierarchical macro cells.

24. A computer readable medium to direct a computer to function in a specified manner, comprising:

first instructions to annotate relative positions of instantiated hierarchical macro cells within a standard cell design, wherein said first instructions include instructions to track the relative positions of individual standard cells contained within said instantiated hierarchical macro cells, and wherein said first instructions include instructions to facilitate the specification of a row offset, a column offset, and a stack offset for individual standard cells contained within said instantiated hierarchical macro cells;

second instructions to convert said relative positions of said instantiated hierarchical macro cells to absolute grid position locations to form a grid assigned circuit; and third instructions to route said grid assigned circuit to form a routed circuit.

25. A computer readable medium to direct a computer to function in a specified manner, comprising:

first instructions to annotate relative positions of instantiated hierarchical macro cells within a standard cell design;

second instructions to convert said relative positions of said instantiated hierarchical macro cells to absolute grid position locations to form a grid assigned circuit, wherein said second instructions include instructions to form a grid assigned placed circuit specifying bit slice datapaths; and third instructions to route said grid assigned circuit to form a routed circuit.

26. The computer readable medium of claim 25 wherein said first instructions include instructions to facilitate the altering of a relative position of a pin to facilitate dense signal line routing within said standard cell design.

27. A computer readable medium to direct a computer to function in a specified manner, comprising:

first instructions to annotate relative positions of instantiated hierarchical macro cells within a standard cell design;

second instructions to convert said relative positions of said instantiated hierarchical macro cells to absolute grid position locations to form a grid assigned circuit, wherein said second instructions include instructions to form a grid assigned placed circuit specifying bit slice datapaths, and wherein said second instructions include instructions to form a bit slice datapath including multiple standard cell instances, each standard cell instance being positionally defined by a column position, a row position, and a stack position; and third instructions to route said grid assigned circuit to form a routed circuit.

28. The computer readable medium of claim 27 further comprising fourth instructions to verify the performance of said routed circuit.

29. A computer readable medium to direct a computer to function in a specified manner, comprising:

first instructions to annotate relative positions of instantiated hierarchical macro cells within a standard cell design;

second instructions to convert said relative positions of said instantiated hierarchical macro cells to absolute grid position locations to form a grid assigned circuit; and third instructions to route said grid assigned circuit to form a routed circuit;

fourth instructions to verify the performance of said routed circuit; and fifth instructions to invoke the operation of said first instructions, said second instructions, and said third instructions when specified circuit performance is not met.

* * * * *